United States Patent
Mates

(10) Patent No.: US 7,496,249 B2
(45) Date of Patent: Feb. 24, 2009

(54) OPTICAL AND/OR ELECTRICAL COMMUNICATIONS FABRICS IN CIRCUIT BOARDS AND/OR OTHER COMPOSITE STRUCTURES

(75) Inventor: John W. Mates, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/323,422

(22) Filed: Dec. 29, 2005

(65) Prior Publication Data

US 2007/0154132 A1 Jul. 5, 2007

(51) Int. Cl.
*G02B 6/12* (2006.01)
*G02B 6/00* (2006.01)

(52) U.S. Cl. .................................. 385/14; 385/147

(58) Field of Classification Search ............. 385/14, 385/16, 25, 147
See application file for complete search history.

(56) References Cited

U.S. PATENT DOCUMENTS

| | | | | |
|---|---|---|---|---|
| 4,088,387 | A * | 5/1978 | Lewis | 385/20 |
| 4,772,092 | A * | 9/1988 | Hofer et al. | 385/13 |
| 5,414,819 | A * | 5/1995 | Redmond et al. | 385/17 |
| 5,415,730 | A * | 5/1995 | Canning et al. | 216/17 |
| 5,524,679 | A * | 6/1996 | Wiener | 139/420 R |
| 6,229,712 | B1 * | 5/2001 | Munoz-Bustamante et al. | 361/783 |
| 6,694,068 | B2 * | 2/2004 | Parker | 385/14 |
| 7,024,086 | B2 * | 4/2006 | Tourne | 385/131 |
| 2005/0063637 | A1 * | 3/2005 | Mershon et al. | 385/15 |

OTHER PUBLICATIONS

Bayindir, Mehmet et al., "Metal-Insulator-Semiconductor Optoelectronics Fibres", Nature Publishing Group, vol. 431, Oct. 14, 2004.
Koncar, Vladan, "Optical Fiber Fabric Displays", Optics & Photonics News, Apr. 2005.
"Weave a Bike: 'Extreme Textiles' Come of Age", The New York Times, Tuesday, Apr. 12, 2005.
L. Wang, et al., "Conventional E-Glass Fibre Light Guides: Self-Sensing Composite Based On Sol-Gel Cladding", Smart Materials and Structures, 13 (2004) 73-81.
Richard Goering, "Bords skirt tradition, flirt with IC techniques", EETimes on Line, Jan. 13, 2006, http:/eetimes.com/news/latest/showArticle.jhtml?articleID=165702785.

* cited by examiner

*Primary Examiner*—Kevin S Wood
*Assistant Examiner*—John M Bedtelyon
(74) *Attorney, Agent, or Firm*—Buckley, Maschoff & Talwalkar LLC

(57) ABSTRACT

An optical and/or electrical communication and structural fabric, method and system. For one aspect, an optical fabric is embedded within a structure to communicate an optical and/or electrical signal and to stiffen the structure. The structure may be a circuit board, for example, and the optical cloth may be used to interconnect devices coupled to the circuit board. For another aspect, the structure may be a different type of structure such as, for example, part of a vehicle, airplane or other structure.

6 Claims, 5 Drawing Sheets

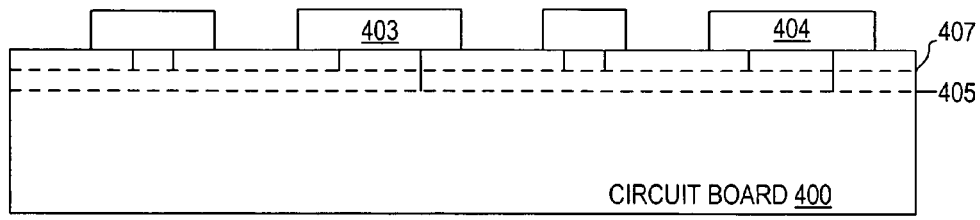
FIGURE 4
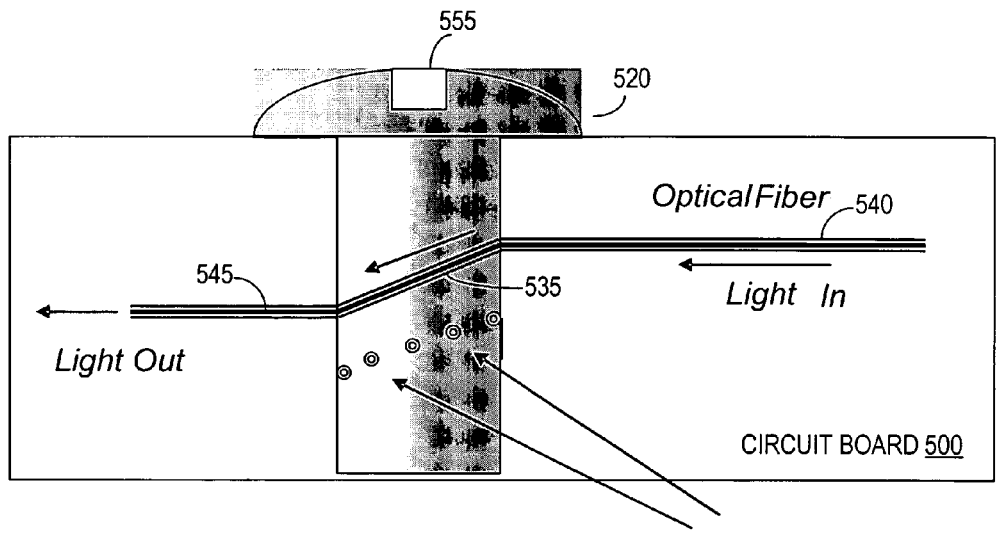
FIGURE 5   CUT ENDS OF ADD'L OPTICAL FIBERS 535
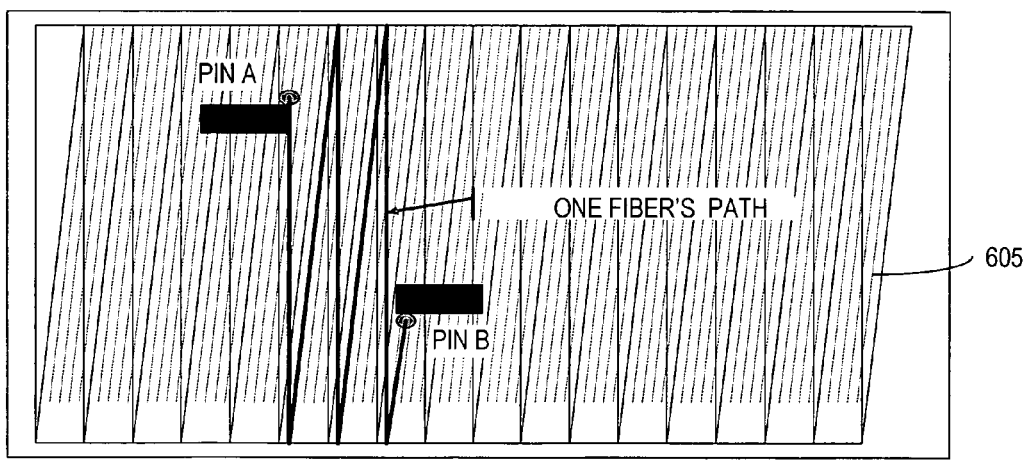
FIGURE 6

OPTICAL AND/OR ELECTRICAL COMMUNICATIONS FABRICS IN CIRCUIT BOARDS AND/OR OTHER COMPOSITE STRUCTURES

BACKGROUND

An embodiment of the present invention relates to the field of signal communication and, more particularly, to an approach for using fiber cloth for communications and/or structural strength.

Current conventional circuit boards are often comprised of multiple resin dielectric layers, each of which may be reinforced by fiberglass cloth to provide structural strength. Electrical signals are typically communicated between multiple devices or components coupled to a circuit board over metal wires deposited on one or more other layers of the circuit board.

BRIEF DESCRIPTION OF THE DRAWINGS

The present invention is illustrated by way of example and not limitation in the figures of the accompanying drawings in which like references indicate similar elements, and in which:

FIG. 4 is a cross-sectional view of a portion of a circuit board of another embodiment including an embedded fiber communications fabric and an optical to electrical signal converter.

FIG. 5 is a cross-sectional view of an optical crossbar plug that may be used to couple two or more fibers of a fiber communications fabric of one or more embodiments.

FIG. 6 is a cross-sectional view of a portion of a circuit board according to another embodiment including a fiber communications cloth folded and embedded in the circuit board.

DETAILED DESCRIPTION

A method and apparatus for communicating signals in a circuit board or other composite structure using an optical and/or electrical fiber communications fabric are described. In the following description, numerous specific details such as particular circuit board materials, types of electronic systems, types of fibers and/or cloths and weaves thereof, and/or types of devices, etc. are described for purposes of illustration. It will be appreciated, however, that other embodiments are applicable to other circuit board materials, types of electronic systems, types of fibers, cloths and/or weaves, and/or types of devices and composite structures, for example.

References to "one embodiment," "an embodiment," "example embodiment," "various embodiments," etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

As discussed above, conventional circuit boards may include multiple resin dielectric layers sandwiched together and reinforced using fiberglass or another material to improve stiffness. Fiberglass may be delivered in many different ways: as "cotton," as "felt," and as woven cloth, for example. The woven cloth fiberglass may even be provided in various weaves. Other fibers such as carbon may also be woven and sold for a similar purpose, namely to provide structural strength to composite products, such as circuit boards, automotive bodies, aircraft wings, boat hulls, etc., made of composite materials.

Figure 1:
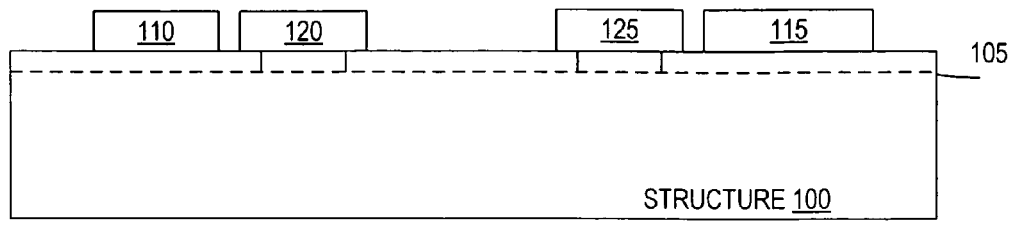
FIG. 1 is a cross-sectional view of a portion of a structure according to one embodiment including a fiber communications fabric embedded in the structure.

Referring to FIG. 1, a cross-section of a portion of an example composite structure 100 according to one embodiment is shown. As shown in FIG. 1, a fiber communications cloth 105 is embedded within the structure 100 to communicate a signal. The fiber communications cloth may communicate optical and/or electrical signals as described in more detail below. The fiber communications cloth may also act to stiffen or otherwise improve the structural strength of the structure 100.

For one embodiment, the structure 100 is a circuit board. For this embodiment, devices such as devices 110 and 115 may be coupled to the circuit board 100 and may be optically and/or electrically coupled to the fiber communications cloth 105 either directly, or, via, for example, optical-to-electrical and/or electrical-to-optical transducers 120 and 125 (which may each comprise one or more electrical-to-optical and/or optical-to-electrical transducers), such that they may be interconnected via one or more fibers of the cloth. In this manner, the fiber communications cloth may provide an optical and/or electrical backplane for the circuit board 100.

Figure 2:
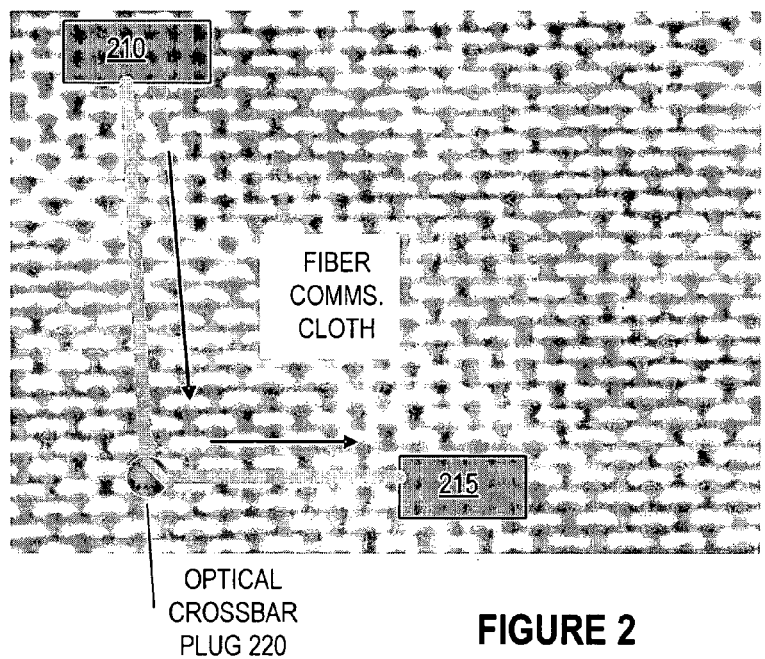
FIG. 2 is an overhead view of an example fiber communications fabric that may be used in the structure of FIG. 1.

FIG. 2 is an overhead view of a portion of a circuit board 200 that may be similar to the circuit board 100. In the overhead view of FIG. 2, the layer(s) of the circuit board 200 that overlie the fiber communications cloth 205 are present but not shown such that the features of the fiber communications cloth 205 may be described in more detail. For this example embodiment, the fiber communications cloth 205 is woven such that optical and/or electrical interconnections between devices or components, such as the devices 210 and 215, may be provided via the cloth 205. While a particular weave is shown for the cloth 205, it will be appreciated that other weaves and/or approaches for interconnecting fibers are within the scope of various embodiments.

For some embodiments, the fibers used to form the fiber communications cloth 205 may be fiber optic fibers. Fiber optic fibers differ from generic fiberglass fibers in that they have at least two indices of refraction so as to cause light to reflect off the outside of the fiber and travel down the inside of the fiber. The losses associated with signals communicated via fiber optic fibers may be relatively small even over relatively large distances. For this reason, fiber optic fibers are now used for communication in some computing environments.

For embodiments for which fiber optic fibers are used to form the fiber communications cloth, devices capable of communicating using optical signals may be optically coupled to the cloth.

Alternatively, devices that communicate with other devices using electrical signals may be coupled to the fiber communications cloth via one or more optical-to-electrical and/or electrical-to-optical signal converters or transducers 403 and 404 as shown for the circuit board 400 in FIG. 4, where the layer 405 is the fiber communications cloth and the layer 407 comprises one or more electrical interconnection layers, which may either be embedded in the circuit board as shown in FIG. 4, or may be on the surface of the circuit board.

Electrical-to-optical and optical-to-electrical transducers are commercially available from a variety of sources. Other types of transducers are in development today and may also be used for some embodiments (see e.g. "Micrometre-scale silicon electro-optic modulator" Qianfan Xu et al., Nature, Vol. 435, Number 7040, p. 325, 19 May 2005). For one embodiment, one or more of the transducers 403 and/or 404 may comprise an optical coupler or optical isolator device that electrically isolates its inputs from its outputs by, for example, causing the inputs to modulate an internal light-emitting diode (LED) and using that LED light to couple to the output side of the device and that includes a glass fiber in the LED light gap.

For some embodiments, the coupling between, for example, one or more electrical-to-optical and/or optical-to-electrical transducers may be accomplished using a coupling device such as the optical cross-bar plug described in more detail below in reference to FIG. 5. For such embodiments, the plug or other coupling device may be used to move a cloth or fabric fiber signal into a light-electrical coupler (e.g. transducer) via a fiber attached to the coupler on one end and penetrating the plug on the other end via, for example, a hole drilled in the middle or another portion of the plug. Alternatively, the plug or other coupling device may be used to move a signal from a transducer into the communications fabric.

Figure 3A:
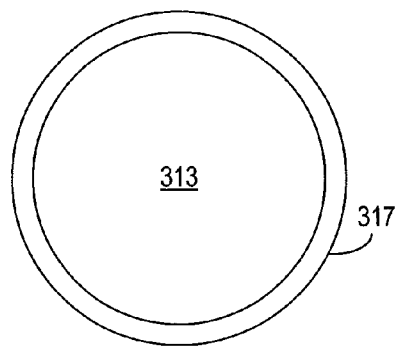
FIG. 3A is a cross-sectional view of an example fiber of one embodiment that may be used to form the fiber communications fabric of various embodiments.

FIG. 3A illustrates a cross-sectional view of another example fiber that may be used to form the fiber communications cloth of one or more embodiments. The fiber 301 includes a core fiber 313 having a first refractive index enclosed in a coating 317 having a lower refractive index such that light traveling in the core 313 is substantially totally reflected back into the core, thus making the fiber 301 effectively an optical fiber such as is currently widely used for communication.

For one embodiment, the core fiber 313 is a fiberglass (e.g. e-glass or s-glass), polymer or other type of fiber that is sufficiently transparent to light to permit communication between two elements via light passing through the length of the fiber (or thread) separating them. For many implementations, this distance may be on the order of one meter or less, but may be different for different implementations.

Figure 3B:
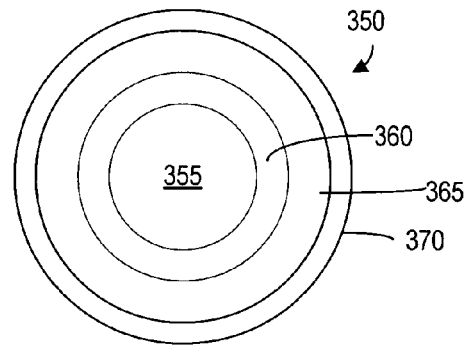
FIG. 3B is a cross-sectional view of an example fiber of another embodiment that may be used to form the fiber communications fabric of various embodiments.

FIG. 3B illustrates a cross-sectional view of another example fiber 350 that may be used to form the fiber communications fabric of one or more embodiments. In this example, the inner core 355 and the adjacent layer 360 may be similar to the core 313 and layer 317 described above in reference to FIG. 3A. An additional coating 365 for this embodiment may be a flexible reflective material, such as metallic aluminum for example, such that the transmission efficiency of the fiber may be further improved. Where the coating 365 is an electrically conductive material, the fibers of the cloth may be capable of communicating both optical and electrical signals. For such embodiments, the fiber 350 may be further coated with an insulator 370 prior to weaving the fiber 350 into a communications fabric thereby providing two physically distinct communication channels.

Alternatively, the core fiber 313 and/or 350 may be a fiber optic or other type of optical fiber and a respective coating may include a flexible electrically conductive material such that the fiber is capable of communicating both electrical and optical signals. For some embodiments, the coating may additionally include an insulator applied over the conductive coating. Other fiber materials are within the scope of various embodiments.

For the embodiments of FIGS. 3A and/or 3B, the coating layers mentioned above may be applied to individual fibers prior to weaving them into a cloth. Alternatively, one or more of the coating layers may be applied after the fiber communications fabric is woven.

Referring back to FIG. 2, for one embodiment, fibers such as those described in reference to FIG. 3A and/or FIG. 3B, true fiber optic fibers or other types of fibers may be woven into a fiber communications fabric or may otherwise be formed or woven into a fiber mesh or grid, for example. The term "cloth" may be used herein to refer to any of these groupings of optically and/or electrically conductive fibers. The fiber communications cloth or fabric may then also be used to provide structural strength to circuit boards or other structures in substantially the same way that current technology uses glass fibers.

As mentioned above, there are many different types of weaves or other approaches for arranging the fibers of the fiber communications cloth. For some embodiments, it may be possible to use mathematical algorithms or another approach to generate a weave to satisfy particular communications constraints and/or to otherwise determine during design, the particular organization of the fibers to provide the desired routing for the structure of interest. For such cases, the fiber communications cloth may provide the needed routing without the use of switches or other mechanisms for re-routing signals after the cloth has been manufactured.

Should re-routing of any signals be required, for some embodiments, an optical crossbar plug 220 (FIG. 2) or other type of switching or routing device may be used. FIG. 5 shows a cross-sectional view of an example optical crossbar plug 520 of one embodiment that may be used to provide for rerouting of signals flowing through circuit boards or other structures on optical fibers from one fiber to another fiber or between multiple fibers. As mentioned above, a similar plug may be constructed to route signals into and out of the communication fabric into, for example, optical/electrical transducers and vice versa.

For one embodiment, where an optical crossbar plug such as the optical crossbar plug 520 is to be used, a cylindrical hole may be drilled vertically through the circuit board 500 or other structure to create a via into which the optical crossbar plug is to be positioned. The via may intersect two or more optical fibers embedded in the structure as described above.

The optical crossbar plug 520 may comprise a rivet-shaped cylindrical plug of the same material as the circuit board or other structure 500 into which it is to be inserted, and may be of substantially the same diameter as the via drilled into the structure. The optical crossbar plug 520 may include optical fibers 535 embedded within the plug. The embedded optical fibers 535 may be any type of fiber compatible with the fibers to be rerouted. Further, for some embodiments, the fibers may be provided in tunnels in the plug that are mirrored or coated with a conductive or other type of material.

At least one of the embedded optical fibers 535 is placed so as to permit light traveling down one of the fibers 540 of the circuit board 500 to enter the plug fiber 535 at one point in the plug and exit the plug fiber 535 at another point so as to enter another fiber 545 embedded within the circuit board 500. In this manner, the optical crossbar plug may be used to enable light to pass from one fiber of the fiber communications cloth to another.

It will be appreciated that transmission losses across such crossbar plugs will depend on a variety of factors such as, for example, the accuracy with which the holes in the circuit board 500 or other structure and the corresponding optical crossbar plugs are machined. Further, the transmission losses may also be related, at least in part, to factors such as the diameter of the optical fibers, the accuracy of the placement of the plugs in the circuit board 500 and/or the degree of polish of the cut ends of the optical fibers in this un-amplified crossbar device.

Crosstalk between fibers at the cut interfaces in the crossbar plugs and circuit boards may need to be controlled. For some embodiments, crosstalk may be controlled by placing the abutments of potentially cross-talking pairs far from each other or embedding/coating the fibers and the plugs with opaque materials so as to confine the light more closely to the desired junctions of light fibers, for example.

For some embodiments, to position the optical crossbar plug more precisely, light flows between pairs of fibers to be connected may be monitored as the plug 520 is inserted and turned in its mating hole in the circuit board or other structure 500. Further, a slot 555 may be machined into the head of the plug to enable more accurate placement of the plug into the circuit board 500 or other structure of interest.

While specific features of an example optical crossbar plug have been described for purposes of illustration, it will be appreciated that a different approach, different type of element and/or an optical crossbar plug configured in a different manner may be used to provide for rerouting of signals communicated via the fiber communications fabric and/or connection to/from optical/electrical transducers of various embodiments.

As mentioned above, the embedded fiber communications fabric of various embodiments may be woven or otherwise arranged to provide a desired routing for some embodiments. Referring to FIG. 6, the embedded fiber communications cloth 605 of some embodiments may also or alternatively be folded or otherwise arranged in a host structure so as to provide at least one connecting fiber between a first point and a second point or a location close to a second point, for example. While a fan-fold type arrangement is shown in FIG. 6, it will be appreciated that a different type of fold may be used for other embodiments.

The embedded fiber communications cloth of some embodiments may comprise multiple different types of fibers. For example, a simple weave of optical and standard non-optical E-glass fibers may be woven so as to balance bandwidth and pitch requirements with cost issues that currently apply to the creation of standard fiberglass cloth reinforced circuit boards. Other combinations of fibers may be used for other embodiments.

Figure 7:
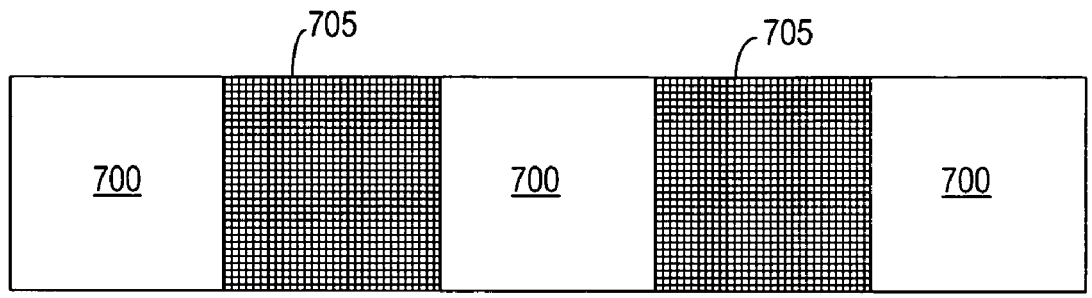
FIG. 7 is an overhead view of fiber communications cloth embedded in and coupling multiple circuit boards.

For various embodiments discussed above, the fiber communications cloth is described as being embedded in a circuit board or other structure to form a communications backplane on a single structure. For some embodiments, the fiber communications cloth of various embodiments may further interconnect multiple structures. For example, referring to FIG. 7, fiber communications cloth 705 may be embedded within and may also interconnect multiple circuit boards 700.

Figure 8:
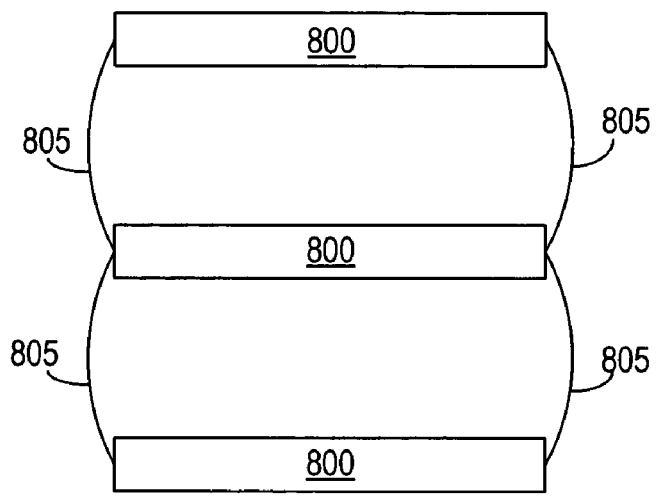
FIG. 8 is a side view of fiber communications cloth embedded in and coupling multiple circuit boards in a stacked configuration.

FIG. 8 is a side view of another approach for interconnecting multiple circuit boards 800 or other structures with fiber communications cloth 805 to provide a stacked configuration. Due to the flexibility and continuity of the fiber communications fabric of various embodiments, it will be appreciated that structures maybe interconnected in a variety of configurations other than those shown and that a different number of structures maybe interconnected.

Figure 9:
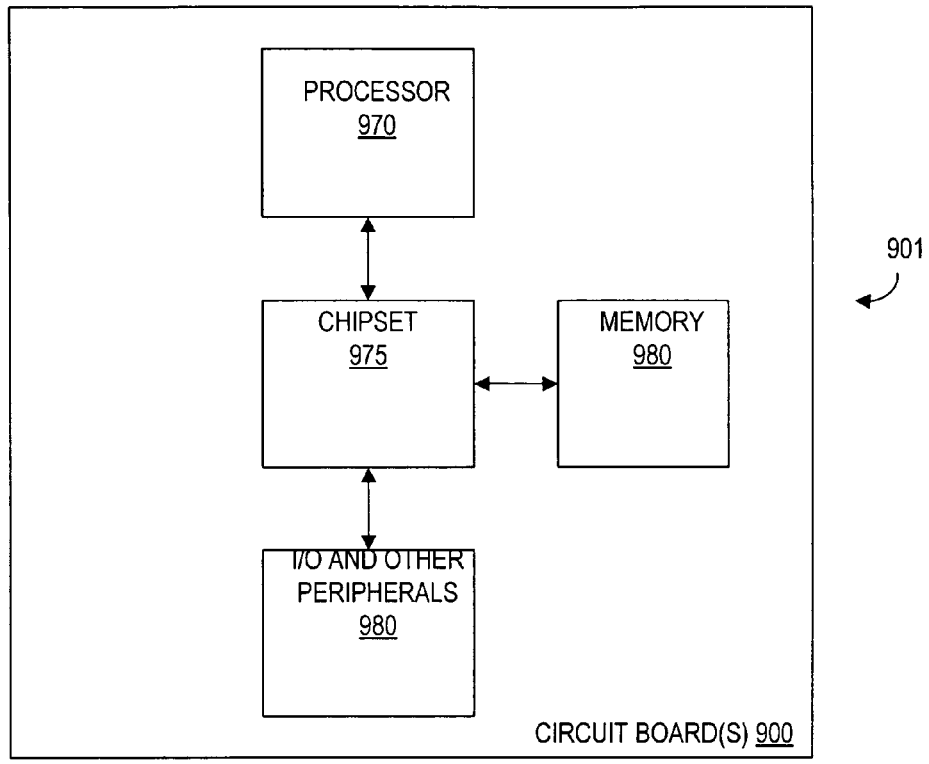
FIG. 9 is a block diagram of an electronic system of one embodiment that may include a circuit board or circuit boards including an embedded fiber communications cloth.

FIG. 9 is a block diagram of an example electronic system 901 of one embodiment in which the fiber communications cloth of one or more embodiments may be implemented. The system 901 is a computing system, but other types of electronic or other types of systems or composite structures may advantageously implement the fiber communications cloth of one or more embodiments.

The system 901 includes a processor 970 to execute instructions, a chipset 975 coupled to the processor 970, which may include, for example, memory control, graphics control and/or input output control capabilities, one or more memories 980 coupled to the chipset 975 and input/output components and/or other peripherals 980 such as, for example, mass storage and/or networking device(s) coupled to the chipset 975.

Components of the system 901 may be coupled via one or more circuit boards 900, which may include embedded fiber communications cloth according to one or more embodiments. In the system 901, the embedded fiber communications cloth (not shown) may provide an optical backplane and/or increase structural strength and/or couple one or more circuit boards 900 of the system 901.

Figure 10:
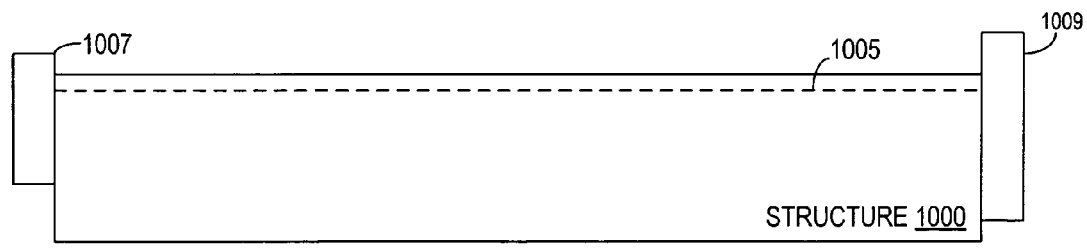
FIG. 10 is a block diagram of a structure of another embodiment including embedded fiber communications cloth.

Many of the embodiments described herein refer to embedding fiber communications cloth in circuit boards. As mentioned above, the fiber communications cloth of various embodiments may alternatively be embedded in a variety of other types of structures, such as, for example, anything currently manufactured with one or more fiberglass layers, to provide communication ability in addition to structural strength. An example of an alternative structure 1000 is shown in FIG. 10, where the embedded fiber communications cloth 1005 provides communication ability between two elements 1007 and 1009. For purposes of illustration, these two points could, for example, represent the cockpit control panel and wingtip lighting system in a modern composite aircraft.

Using the embedded fiber communications cloth approaches of various embodiments, the usefulness of cloth reinforcement typically embedded in the epoxy of a modern circuit board may be increased by also using the cloth as an optical and/or electrical communications backplane connecting various elements. Further, for some embodiments, the communication bandwidth between devices on a circuit board or other structure may be increased. Additionally, radiated electromagnetic noise levels may be reduced and the number of layers in a circuit board, for example, may be reduced. Where the fiber communications cloth provides for an optical backplane, heat dissipation may also be reduced.

Figure 11:
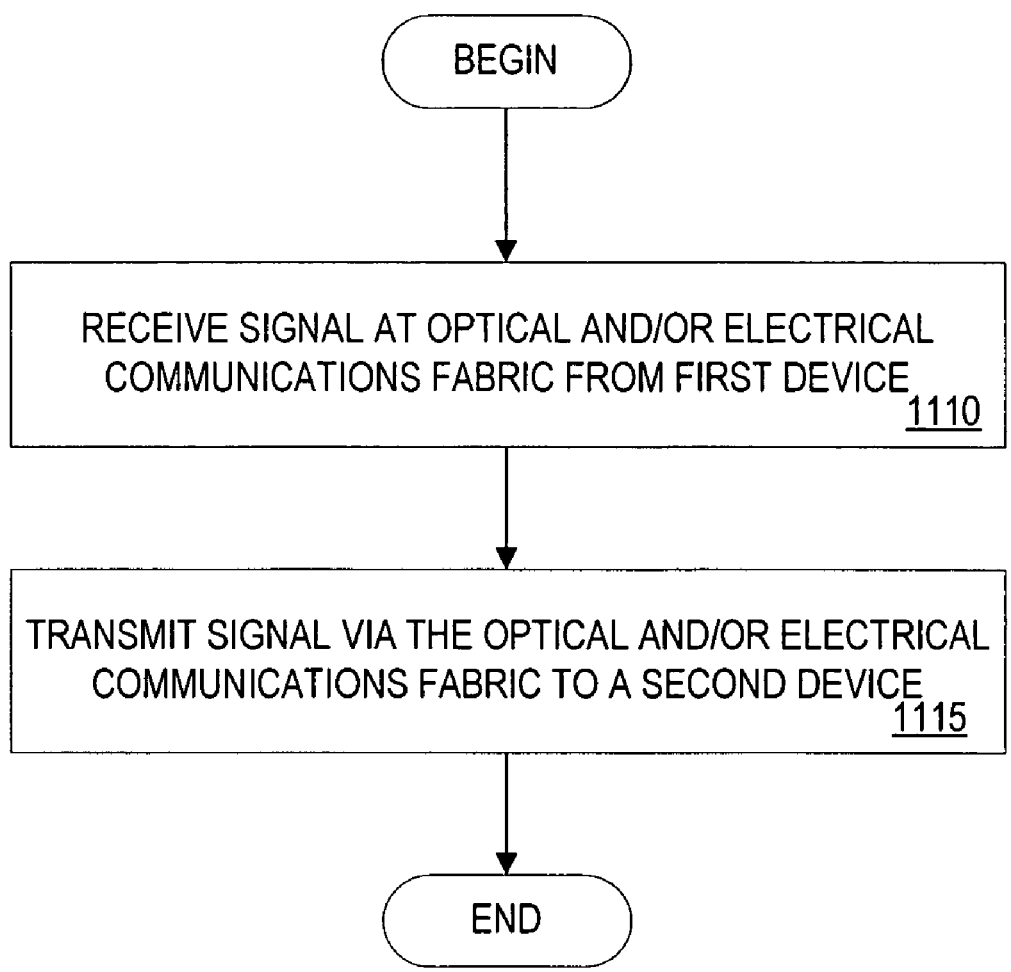
FIG. 11 is a flow diagram showing a method of one embodiment for communicating signals in a circuit board using a fiber communications cloth.

FIG. 11 is a flow diagram showing a method of one embodiment for communicating optical and/or electrical signals. At block 1110, a signal generated at a first device is received at an optical and/or electrical fabric embedded in a composite structure to which the first device is coupled, wherein the optical and/or electrical fabric also acts to stiffen the composite structure. At block 1115, the signal is communicated via the optical and/or electrical fabric to a second device coupled to the fabric.

It will be appreciated that the method of various embodiments may include additional actions not shown or described in reference to FIG. 11.

Thus, various embodiments and approaches for providing optical signal communication in a circuit board are described. In the foregoing specification, the invention has been described with reference to specific exemplary embodiments thereof. It will, however, be appreciated that various modifications and changes may be made thereto without departing from the broader spirit and scope of the invention as set forth in the appended claims. For example, while the structures of various embodiments have been described as including a single layer of fiber communications cloth, the structures of other embodiments may include multiple layers of such cloth, which may or may not be interconnected. Further, analog and/or digital signals may be communicated using the fiber communications cloth of one or more embodiments. The specification and drawings are, accordingly, to be regarded in an illustrative rather than a restrictive sense.

What is claimed is:

1. An apparatus comprising:
   a circuit board;
   an optical fiber cloth embedded within the circuit board, the optical fiber cloth including at least a first optical fiber that is substantially perpendicular to a second optical fiber in a same layer and plane of the optical fiber cloth, the optical fiber cloth to communicate an optical signal and to stiffen the circuit board, wherein the optical fiber cloth further includes perpendicular optical fibers in the same layer and plane that are structured to communicate electrical signals; and
   an optical crossbar plug to optically couple at least two optical fibers of the optical fiber cloth, the optical crossbar plug including:
   a cylindrical plug in a via of the circuit board, and
   at least one embedded optical fiber to optically couple the at least two optical fibers of the optical fiber cloth.

2. The apparatus of claim 1 wherein the optical fiber cloth is to optically interconnect at least two devices on the circuit board.

3. The apparatus of claim 1 further comprising a transducer coupled to the optical cloth to convert an electrical signal from a device coupled to the circuit board into an optical signal to be provided to the optical fiber cloth.

4. The apparatus of claim 1 wherein the optical fiber cloth includes at least one fold.

5. An apparatus comprising:
   a circuit board;
   at least first and second devices coupled to the circuit board; and
   an optical fiber cloth embedded within the circuit board to optically couple at least the first and second devices, the optical fiber cloth including at least a first optical fiber that is substantially perpendicular to a second optical fiber in a same layer and plane of the optical fiber cloth, the optical fiber cloth to communicate an optical signal and to stiffen the circuit board, wherein the optical fiber cloth further includes perpendicular optical fibers in the same layer and plane that are structured to communicate electrical signals; and
   an optical crossbar plug to optically couple at least two optical fibers of the optical fiber cloth, the optical crossbar plug including:
   a cylindrical plug in a via of the circuit board, and
   at least one embedded optical fiber to optically couple the at least two optical fibers of the optical fiber cloth.

6. The apparatus of claim 5 further comprising a transducer coupled to the circuit board to convert an electrical signal into an optical signal to be communicated via the optical fiber cloth.

* * * * *